United States Patent
Nishiyama

[11] Patent Number: 5,252,931
[45] Date of Patent: Oct. 12, 1993

[54] WIDE BAND FREQUENCY AMPLIFIERS

[75] Inventor: Seiichi Nishiyama, Kanagawa, Japan

[73] Assignee: Sony Corporation, Tokyo, Japan

[21] Appl. No.: 913,967

[22] Filed: Jul. 17, 1992

[30] Foreign Application Priority Data

Jul. 17, 1991 [JP] Japan .................................. 3-203799
Sep. 30, 1991 [JP] Japan ............................. 63-87493[U]

[51] Int. Cl.$^5$ ................................................ H03F 3/30
[52] U.S. Cl. .................................. 330/263; 330/126; 330/267; 330/295
[58] Field of Search ............... 330/126, 151, 262, 263, 330/267, 268, 273, 274, 295

[56] References Cited

U.S. PATENT DOCUMENTS

| | | | |
|---|---|---|---|
| 4,367,442 | 1/1983 | Tanaka et al. | 330/295 X |
| 4,431,972 | 2/1984 | Ishii | 330/267 |
| 4,454,479 | 6/1984 | Spires | 330/267 X |
| 4,945,259 | 7/1990 | Anderson | 307/296.1 |

*Primary Examiner*—James B. Mullins
*Attorney, Agent, or Firm*—Hill, Steadman & Simpson

[57] ABSTRACT

Disclosed is a a wide band frequency amplifier comprising the following: A first and a second transistor constitute a first push-pull amplifier circuit. A first current source is included, of which one end is connected to the second transistor base, the other end connected to ground. A first bias voltage source is interposed between the bases of the first and the second transistors. A third transistor is coupled with the first transistor in Darlington connection, thereby driving the first and the second transistors using an input signal. A fourth and a fifth transistor constitute a second push-pull amplifier circuit. A second current source is provided, of which one end is connected to the fourth transistor base, the other end connected to ground. A second bias voltage source is interposed between the bases of the fourth and the fifth transistors. A sixth transistor is coupled with the fourth transistor in Darlington connection, thereby driving the fourth and the fifth transistors using the input signal. A phase element is interposed between the second transistor base and the output end of the second push-pull amplifier circuit, thus causing the second and the fifth transistors to operate in Darlington connection at a trailing edge of the input signal.

4 Claims, 6 Drawing Sheets

INPUT SIGNAL
OF $V_{IN}$ $V_{P-P}$ $t_{min}$ (SEVERAL HUNDRED psec.)

EMITTER CURRENT
OF Q2

$I_{max}$

EMITTER CURRENT
OF Q3

$I_{max}$

EMITTER CURRENT
OF Q5

$nI_1$

WIDE BAND FREQUENCY AMPLIFIERS

BACKGROUND OF THE INVENTION

1. Field of the Invention

The present invention relates to wide band frequency amplifiers and, more particularly, to wide band frequency amplifiers that admit input signals of large amplitudes on the high frequency band.

2. Description of the Prior Art

Heretofore, push-pull amplifier circuits of the type shown in FIG. 1 have been widely used as an output stage circuit. The prior art output stage circuit such as this one typically comprises an NPN type transistor Q1 and a PNP type transistor Q2 connected via their emitters. The transistors Q1 and Q2 act alternately in response to a leading edge and a trailing edge of an input signal $V_{IN}$.

A bias voltage source V1 for the transistors Q1 and Q2 is applied between the bases thereof. In addition, the base of the PNP type transistor Q2 is connected to a current source 2, the other end of the current source 2 being connected to ground. The transistor Q1 is coupled with a transistor Q in Darlington connection. The collector of the transistor Q1 is connected to a reference voltage source Vcc. The base of the transistor Q3 is fed with the input signal $V_{IN}$ from a signal source 3 via a signal source resistor R1.

The rising characteristic of the output stage circuit 1 given the input signal $V_{IN}$ is high thanks to the transistors Q1 and Q3 being held in Darlington connection. The falling characteristic of the output stage circuit 1 is determined by the amount of an emitter current that flows through the PNP type transistor Q2. This is because the terminal capacitor C1 for pins or other elements connected to the output end of the circuit must be driven by that emitter current.

The time $t_f$ required for an output signal $V_{OUT}$ to fall (see FIG. 2) is represented by the equation:

$$t_f = \frac{C \cdot A}{I(h_{FE} + 1)} \quad (1)$$

where, A stands for the amplitude of the input signal (Vpp), I for the current that flows through the current source 2, $h_{FE}$ for the current amplification factor of the transistor Q2, and C for the capacitance of the terminal capacitor C1.

In the setup above, the cut-off frequency $f_{max}$ of the frequency characteristic f decreases even if the input amplitude A becomes smaller or if the current amplification factor $h_{FE}$ is lowered, as indicated by the equation:

$$f_{max} = \frac{0.35}{t_f} = \frac{0.35 \cdot I \cdot (h_{FE} + 1)}{C \cdot A} \quad (2)$$

Given this characteristic, to widen the frequency band requires boosting the current I that flows through the current source 2 or enlarging the current amplification factor $h_{FE}$.

The current source 2 is constituted by an NPN transistor Q4 having a fixed bias voltage source connected thereto, as shown in FIG. 3. Thus increasing the current I reduces the current amplification factor $h_{FE}$ of the transistor Q4. This lowers the base voltage and causes a negative feedback, putting constraints on the maximum current that may flow through the current source 2.

One way to bypass this drawback is to increase the maximum current by widening the cell area of the NPN type transistor Q4. But this would raise the parasitic capacitances $C_{CS}$ and $C_{CB}$ of the transistor Q4. With the cell area of the PNP transistor Q1 also needed to be widened correspondingly, the parasitic capacitance $C_{CB}$ of the transistor Q1 would also be raised.

Because simply boosting the amount of the current flowing through the current source 2 would entail increases in parasitic capacitance, an additional current required to drive that capacitance hampers the attempt to expand the frequency band as desired. Furthermore, in a situation where the current amount is raised while the input signal $V_{IN}$ is withheld, the current I that flows through the current source 2 flows into the transistor Q3 as an emitter current. This requires furnishing an emitter follower amplifier circuit upstream for driving the transistor Q3. That in turn restricts the dynamic range of the output signal $V_{OUT}$.

On the other hand, attempts to raise the current amplification factor $h_{FE}$ are hampered by the fact that the higher the frequency band, the smaller the current amplification factor $h_{FE}$ of the PNP type transistor Q2. Thus the cut-off frequency $f_{max}$ may not be raised. For example, input signals of large amplitudes permit band expansion of only a third to half of the transition frequency $f_T$. The degraded frequency characteristic on the high frequency band must be compensated by getting large currents to flow.

Another way to improve the frequency characteristic is to have a PNP type transistor Q7 coupled with a transistor Q5 in Darlington connection, the base of the transistor Q7 being connected to a connective midpoint between a current source 4 and a bias voltage source V3, as shown in FIG. 4. In this case, the minimum value of the output signal $V_{OUT}$ fails to become lower than a level of 2 Vbe+Vsat, where Vsat represents the voltage of an NPN type transistor Q8 constituting part of the current source 4. As a result, the dynamic range is narrowed.

Prior art push-pull circuits of the above-described construction have a fixed value of the current I flowing through the constant current source 2 or 4. This arrangement is intended to have the transistor Q2 or Q5 drive the load capacitance C at a desired frequency.

It should be noted here that the higher the frequency, the smaller the current amplification factor $h_{FE}$ for the transistor Q2 or Q5. This is because the transition frequency $f_T$ of PNP type transistors is lower than that of NPN type transistors. Given the characteristic, extending the frequency characteristic f up to the desired level requires raising the current I of the constant current source 2 or 4.

Meanwhile, with the input signal withheld, the emitter current of the transistor Q3 or Q6 becomes the constant current I. Raising the current I promotes a voltage drop $I_0/\{h_{FEN1}+1\}$ resulting from the combination of the input impedance $R_L$ of the transistor Q3 or Q6 and the base current flowing therethrough ($h_{FEN1}$: current amplification factor of transistor Q3 or Q6). This in turn narrows the dynamic range.

One solution to the above drawback is to provide another transistor for driving the transistor Q3 or Q6. However, this arrangement also reduces the dynamic range for the reason described. Given the above constraints, raising the current I has not been an easy task.

OBJECTS AND SUMMARY OF THE INVENTION

It is therefore an object of the present invention to provide wide band frequency amplifiers capable of expanding their frequency characteristic during input of signals of large amplitudes.

It is another object of the invention to provide wide band frequency amplifiers capable of both improving their frequency characteristic and ensuring the necessary dynamic range.

In carrying out the invention and according to one aspect thereof, there is provided a wide band frequency amplifier comprising: a first and a second transistor for constituting a first push-pull amplifier circuit; a first current source of which one end is connected to the base of the second transistor, the other end of the first current source being connected to ground; a first bias voltage source connected interposingly between the base of the first transistor and that of the second transistor; a third transistor coupled with the first transistor in Darlington connection, the third transistor driving the first and the second transistors using an input signal; a fourth and a fifth transistor for constituting a second push-pull amplifier circuit; a second current source of which one end is connected to the base of the fourth transistor, the other end of the second current source being connected to ground; a second bias voltage source connected interposingly between the base of the fourth transistor and that of the fifth transistor; a sixth transistor coupled with the fourth transistor in Darlington connection, the sixth transistor driving the fourth and the fifth transistors using the input signal; and a phase element connected interposingly between the base of the second transistor and the output end of the second push-pull amplifier circuit, the phase element causing the second and the fifth transistors to operate in Darlington connection at a trailing edge of the input signal.

According to another aspect of the invention, there is provided a wide band frequency amplifier comprising: a first and a second transistor for constituting a push-pull amplifier circuit; a first current source of which one end is connected to the base of the second transistor, the other end of the first current source being connected to ground; a first bias voltage source connected interposingly between the base of the first transistor and that of the second transistor; a third transistor coupled with the first transistor in Darlington connection, the third transistor driving the first and the second transistors using an input signal; a fourth transistor connected to the third transistor in parallel, the base of the fourth transistor admitting the input signal; a second current source of which one end is connected to the emitter of the fourth transistor, the other end of the second current source being connected to ground; and a phase element connected interposingly between the emitter of the fourth transistor, the second current source and the base of the second transistor, the phase element pulling the base current of the second transistor into the second current source at a trailing edge of the input signal.

According to a further aspect of the invention, there is provided a wide band push-pull amplifier comprising: an output push-pull circuit containing a second and a third transistor, the second transistor being an NPN transistor, the third transistor being a PNP transistor; a first transistor furnished in an input stage in order to drive the second transistor, the first transistor being coupled with the second transistor in Darlington connection; a bias circuit furnished interposingly between the emitter of the first transistor and a current source, the bias circuit supplying a bias current to the base of the second transistor and to that of the third transistor; and a fifth transistor connected interposingly between the base of the third transistor and a power source, the fifth transistor sending to the current source a current not passing through the emitter of the first transistor.

Further objects, features and advantages of the invention will become more apparent upon a reading of the following description and appended drawings.

DESCRIPTION OF THE PREFERRED EMBODIMENTS

Figure 5:
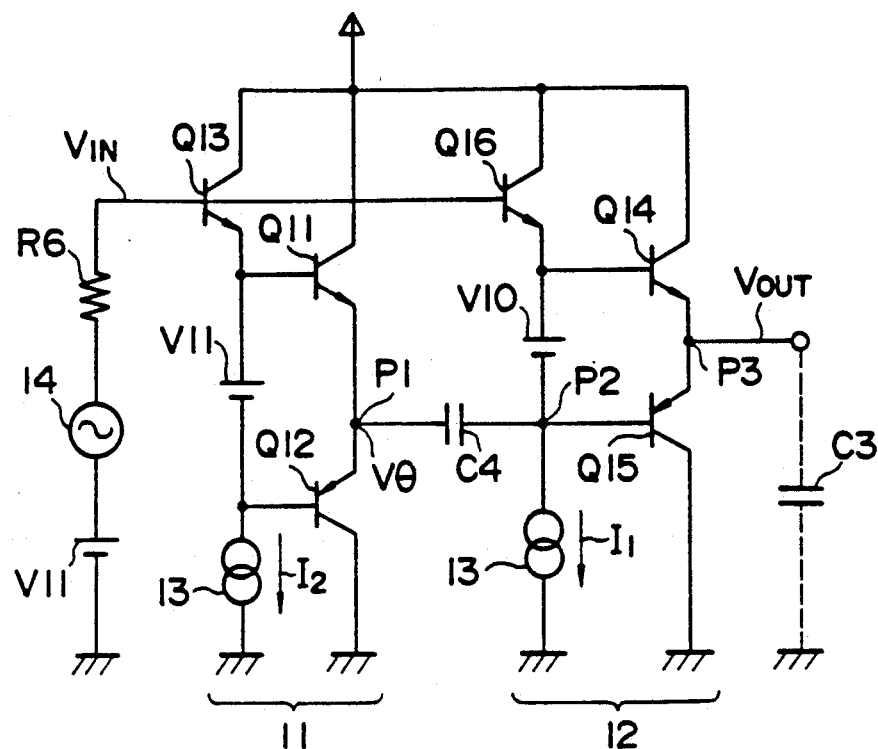
FIG. 5 is a circuit diagram of a wide band push-pull amplifier practiced as a first embodiment of the invention.

The first embodiment of the invention will now be described with reference to FIG. 5. In FIG. 5, the embodiment is an output stage circuit comprising a first amplifier circuit 11 and a second amplifier circuit 12, the two circuits being similarly constructed. The first amplifier circuit 11 contains a push-pull amplification stage made of an NPN type transistor Q11 and a PNP type transistor Q12. The output terminal P1 of the transistors Q11 and Q12 is connected via a capacitor C4 to the base of a transistor Q15 in the second amplifier circuit 12.

The capacitor C4 has a capacitance of several pF, and acts only during a time $t_f$ required for an input signal $V_{IN}$ to fall. When the capacitor C4 is activated, the transistors Q15 and Q12 combine to form a Darlington connection via the capacitor C4 interposed therebetween. At this point, the base current of the transistor Q15 constituting part of the second amplifier circuit 12 is pulled into the transistor Q12 together with a current from a current source 13.

The base of the PNP type transistor Q12 in the first amplifier circuit 11 is connected to a current source 13. A bias voltage source V11 is connected interposingly between the base of the transistor Q11 and that of the transistor Q12. The transistor Q11 is coupled with a PNP type transistor Q13 in Darlington connection. The base of the transistor Q13 is connected commonly with the base of a transistor Q16 in the second amplifier circuit 12.

In operation, the input signal $V_{IN}$ rises as it enters the first and the second amplifier circuits 11 and 12 connected in parallel. The leading edge of the input signal $V_{IN}$ turns on a transistor Q14 and the transistor Q16 in the second amplifier circuit 12. This in turn causes an output signal $V_{OUT}$ to rise. When the input signal $V_{IN}$ falls, the transistors Q12 and Q15 in the first and the second amplifier circuits 11 and 12 are turned on, respectively. This causes the potential at the output terminals P1 and P3 to fall.

Figure 6:
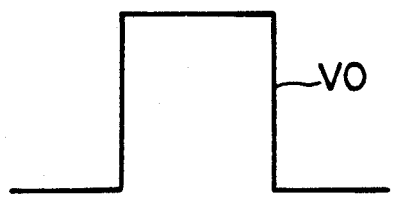
FIG. 6 is a waveform representation of the output given by the first embodiment of FIG. 5.

At this point, an output signal VO appears at the output terminal P1 of the first amplifier circuit 11, the signal VO falling in a square wave form as depicted in FIG. 6. This is because the output terminal P1, unlike the output terminal P3 of the second amplifier circuit 12, has no terminal load C1 of a large capacitance. The capacitor C4 is activated only during the time required for the output signal VO to fall. Thus the PNP type transistor Q12 in the first amplifier circuit 11 and the PNP type transistor Q15 in the second amplifier circuit 12 operate apparently in Darlington connection.

As a result, the base current of the transistor Q15 is also pulled into the transistor Q12 via the capacitor C4. The current amplification factor $h_{FE}$ of the PNP type transistors Q15 and Q12 becomes equivalent to $h_{FE}$ ($h_{FE}+1$). This causes a rise in the emitter current of the transistor Q15 for driving the capacitance C1 of the output terminal P3, the current rise being equal to ($h_{FE}+1$) times the emitter current in effect if the second amplifier circuit 12 alone were to operate. Thus the slew rate for the output signal $V_{OUT}$ to fall is further boosted.

Figure 4:
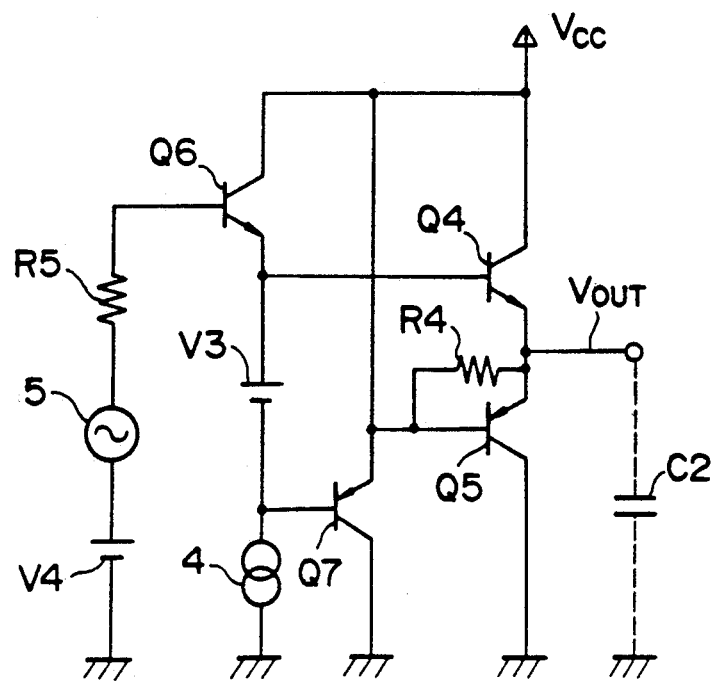
FIG. 4 is a connection diagram of a second prior art output stage circuit.

The potential of the output terminal P1 and that of a connective midpoint P2 equal the emitter follower output (0 dB) having the same gain. Because these two elements operate only at a trailing edge of the input signal $V_{IN}$, the frequency characteristic remains unchanged regardless of the gain of the input signal $V_{IN}$. The lower limit of the dynamic range for the output terminal P3 is determined by two factors: the drop in voltage between base and emitter of the PNP transistor Q15, and the drop in voltage of the current source 13. In this way, compared with the prior art output stage circuit of FIG. 4, the circuit of FIG. 5 has the falling characteristic of its output signal waveform improved significantly in a dynamic range widened by the amount of the base-to-emitter voltage drop of the transistor Q7.

In the above construction, the first and the second amplifier circuits 11 and 12 made of push-pull circuits are driven by the same input signal $V_{IN}$. The output terminal P1 of the first amplifier circuit 11 is connected to the base of the PNP type transistor Q15 of the second amplifier circuit 12 via the capacitor C4. When the input signal $V_{IN}$ falls, the capacitor C4 is turned on. This causes the transistors Q15 and Q12 to operate in Darlington connection. Thus the drive current of the transistor Q15 is increased without narrowing the dynamic range of the output signal $V_{OUT}$. Even when an input signal $V_{IN}$ of a large amplitude comes in, the frequency characteristic is improved more appreciably than ever before.

Figure 7:
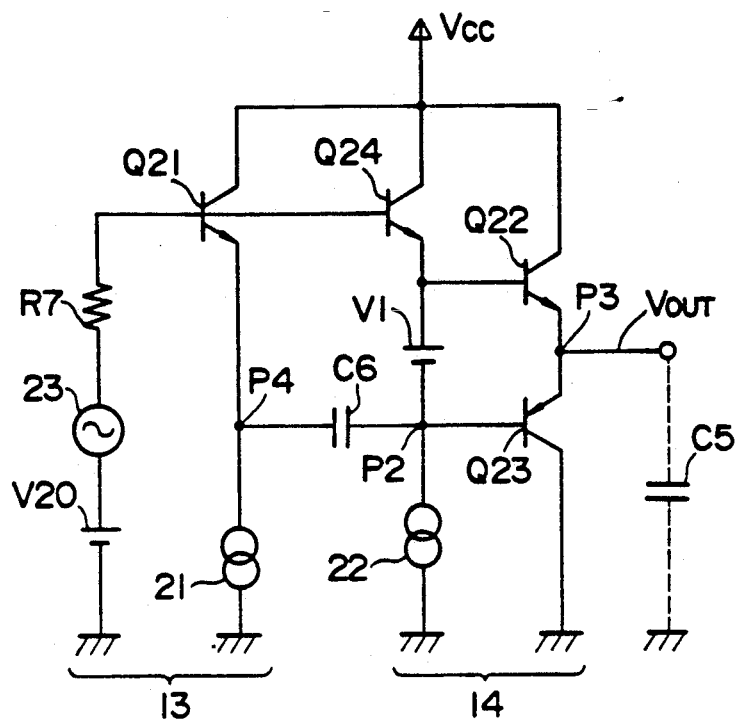
FIG. 7 is a circuit diagram of a wide band push-pull amplifier practiced as a second embodiment of the invention.

In the above-described first embodiment, the base current of the PNP type transistor Q15 in the output stage circuit is pulled into the transistor Q12 via the capacitor C4 together with the current from the current source 13. Alternatively, the same effect is obtained by pulling a current into the connective midpoint P2 from a current source 21 via a capacitor C6. This structure in fact constitutes the second embodiment of the invention, a circuit diagram of which is shown in FIG. 7.

The second embodiment will now be described with reference to FIG. 7. As depicted in FIG. 7, the embodiment comprises a first amplifier circuit 13 and a second amplifier circuit 14. The first amplifier circuit 13 constitutes an emitter follower circuit made of an NPN type transistor Q21 and a current source 2. The output terminal P4 of the first amplifier circuit 13 is connected via the capacitor C6 to the base of a transistor Q23 in the second amplifier circuit 14. The capacitor C6 has a capacitance of several pF, and acts only during the time $t_f$ required for the input signal $V_{IN}$ to fall.

In operation, the input signal $V_{IN}$ rises as it enters the first and the second amplifier circuits 13 and 14 connected in parallel. The leading edge of the input signal $V_{IN}$ turns on transistors Q22 and Q24 in the second amplifier circuit 14. This in turn causes the output signal $V_{OUT}$ to rise. When the input signal $V_{IN}$ falls, the transistors Q21 and Q23 in the first and the second amplifier circuits 13 and 14 are turned on, respectively. This causes the potential at the output terminals P4 and P3 to fall in the presence of the current sources 21 and 22.

Figure 1:
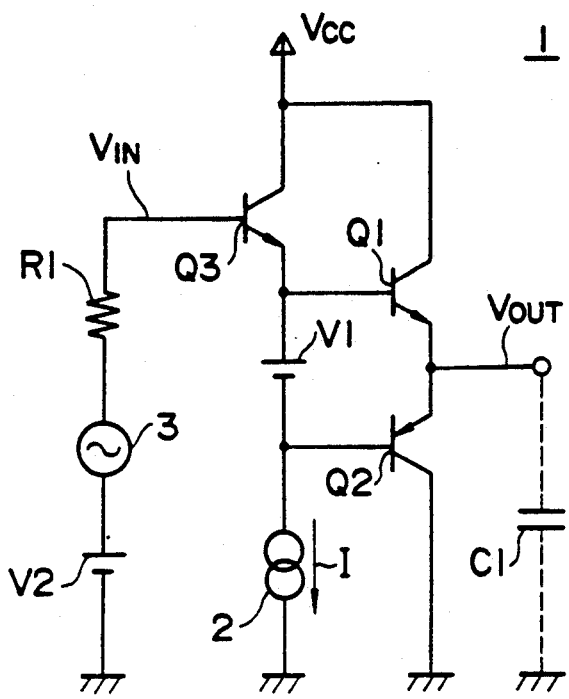
FIG. 1 is a connection diagram of a first prior art output stage circuit.
Figure 2:
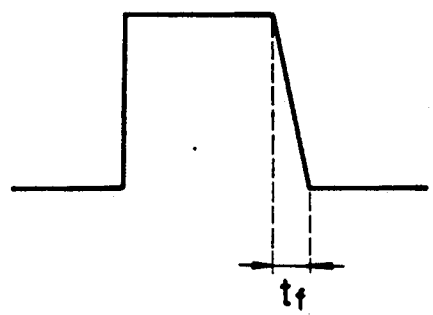
FIG. 2 is a waveform representation of the output signal given by the first prior art output stage circuit of FIG. 1.
Figure 3:
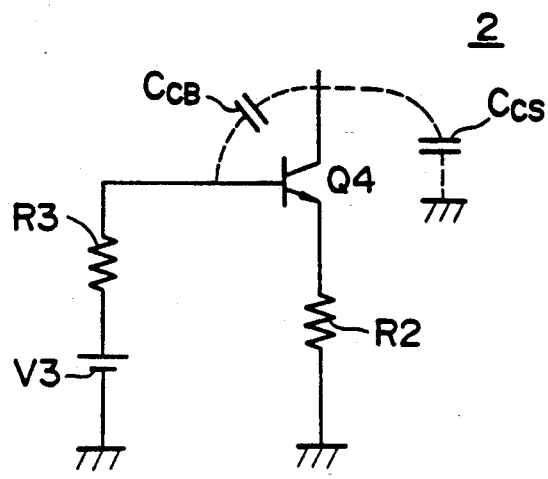
FIG. 3 is a connection diagram of a current source for use with the first prior art output stage circuit.

At this point, an output signal VO appears at the output terminal P4 of the first amplifier circuit 13, the signal VO falling in a square wave form as depicted in FIG. 6. This is because the output terminal P4 of the first amplifier circuit 13, unlike the output terminal P3 of the second amplifier circuit 14 (whose waveform is shown in FIG. 2), has no terminal load C5 of a large capacitance. The capacitor C6 is activated by the current source 21 only during the time $t_f$ required for the output signal VO to fall. This causes an instantaneous drop in voltage at the output terminal P2 and boosts the base current of the transistor Q23. In this manner, the slew rate for the output signal $V_{OUT}$ to fall is further enhanced.

In the first embodiment described earlier, the transistors in the first and the second amplifier circuits 11 and 12 have the same cell area each. An alternative to this aspect of the first embodiment involves making the transistor cell area for the second amplifier circuit 12 n times that of the first amplifier circuit 11. In another aspect, the first embodiment has the capacitor C4 connected interposingly between the output terminal P1 of the first amplifier circuit 11 and the connective midpoint P2 of the second amplifier circuit 12. Alternatively, the output terminal of the first amplifier circuit 11 may be connected direct to that of the second amplifier circuit 12. Such alternatives also apply to the second embodiment.

As described, the first and the second embodiments have their phase element connected to the base of the second transistor in the first push-pull amplifier circuit. When the input signal falls, the base current flowing to the second transistor is pulled in via the phase element. This boosts the base current that drives the second transistor. As a result, the emitter current flowing to the second transistor is increased without narrowing the dynamic range. Even during input of signals having large amplitudes, the falling slew rate is enhanced significantly.

Figure 8:
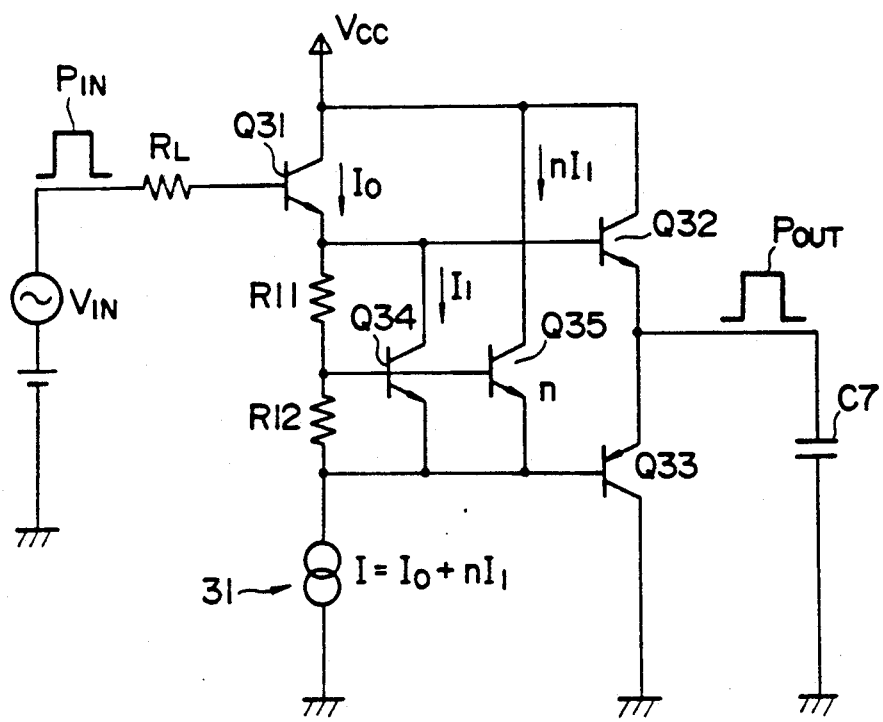
FIG. 8 is a circuit diagram of a wide band push-pull amplifier practiced as a third embodiment of the invention.
Figure 9:
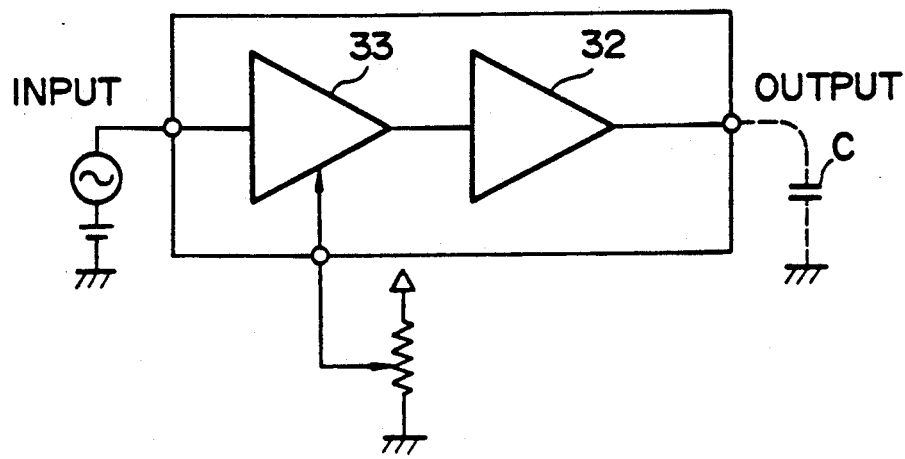
FIG. 9 is a schematic view of the interior of an IC contained in the third embodiment of FIG. 8.

The third embodiment of the invention will now be described with reference to FIG. 8. FIG. 8 is a circuit diagram of a wide band push-pull amplifier practiced as the third embodiment. An input signal first enters a signal source $V_{IN}$. In the circuit of FIG. 8, $R_L$ stands for an equivalent input resistor. In an IC construction (FIG. 9) contained in the third embodiment, that resistor represents the output impedance of an amplifier 33 connected upstream of an amplifier 32.

In the third embodiment, a bias circuit made of resistors R11 and R12 and of a transistor Q34 determines the idling current of a second and a third transistor Q32 and Q33. A capacitor C7 connected to the collector of the third transistor Q33 amounts to the capacitance covering the pad capacitance of the IC chip and the pin capacitance of the IC package. A first transistor Q31 is provided to drive the second transistor Q32. As with the prior art circuit, the third embodiment has the first and the second transistors Q31 and Q32 constitute a Darlington connection.

In the above-described wide band push-pull amplifier practiced as the third embodiment of the invention, the amount of the current of a constant current source 31 is obtained as follows. Where Vp-p stands for the amplitude of the output by the circuit of FIG. 8, $f_{max}$ for the frequency to be acquired, and $t_{min}$ for the time required for the output signal to rise or fall, one gets:

$$\pi \cdot f_{max} \cdot V_{p-p} = S \cdot R \qquad (3)$$

$$\frac{I_{max}}{C_7} = \frac{V_{p-p}}{t_{min}} = S \cdot R \qquad (4)$$

A maximum current Imax is obtained from equations (3) and (4) above as follows:

$$I_{max} = \pi \cdot f_{max} \cdot V_{p-p} \cdot C_7 \qquad (5)$$

That is, where the amplitude of the desired output by the circuit of FIG. 8 is $V_{p-p}$, the maximum frequency involved is $f_{max}$ and the load capacity is C7, the emitter current for the transistors Q32 and Q33 is needed by as much as the maximum current Imax acquired with equation (5).

Where $h_{FEP}$ stands for the current amplification factor of the NPN transistor, the current I of the constant current source 31 becomes necessary by the amount obtained with equation (5) above. That is, $$I \geq \frac{I_{max}}{h_{FE}+1} = \frac{\pi \cdot f_{max} \cdot V_{p-p} \cdot C}{h_{FE}+1}$$

As evident from equation (5), the transition frequency $f_T$ of the PNP transistor, unlike that of the NPN transistor, is associated with lower current amplification factors $h_{FEP}$ where the maximum frequency $f_{max}$ is higher. This means that a current $I_0$ flowing through the current source needs to be increased to compensate for the reductions in the current amplification factor.

As an example, suppose that a current $I_{100}$ required at 100 MHz is compared with a current $I_{200}$ required at 200 MHz. In this case, the current $I_{100}$ for the 100 MHz band is given as $$I_{100} = (100 \cdot Vm)/(10+1)$$

The current $I_{200}$ for the 200 MHz band is given as $$I_{200} = (200 \cdot Vm)/(5+1)$$

Therefore, $$I_{100}/I_{200} = 3.7 \text{ (approx.)}$$

This means that on the high frequency band, a frequency doubled must be matched with a current approximately quadrupled. The higher the frequency, the more current required.

As described, conventional attempts to boost the current $I_0$ flowing through the current source cause an increase in the emitter current of the first transistor Q31. This leads to a DC loss in the resistance of the resistor $R_L$ times $1/(h_{FEN}+1)$, thereby reducing the dynamic range of the amplifier.

Variations in the current amplification factor $h_{FE}$ of the NPN transistor alter the dynamic range, promoting dynamic range deviations. One solution to this drawback is to place the first transistor Q31 in Darlington connection. But this would further reduce the dynamic range.

With the third embodiment, the frequency characteristic is improved without causing such disadvantages. This is achieved, as shown in FIG. 8, by interposingly connecting a fifth transistor Q35 between a power source Vcc and the base of the transistor Q33, the base of the transistor Q35 being connected commonly with the base of a fourth transistor Q34.

With the fifth transistor Q35 in place and with a current $nI_1$ flowing therethrough, the current I flowing through the constant current source 31 is given as $$I_0 + nI_1$$

Thus the current flowing through the constant current source 31 is increased without raising the current $I_0$ flowing to the emitter of the first transistor Q31. As a result, at trailing edges of the input signal, the load capacitance C7 is driven by currents of up to $(I_0 + nI_1) \cdot (h_{FEP}+1)$.

Figure 10:
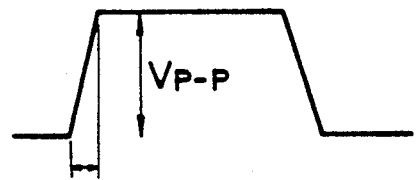
FIG. 10 is a waveform representation of currents that flow through some of the elements constituting the third embodiment of FIG. 8.
Figure 10:
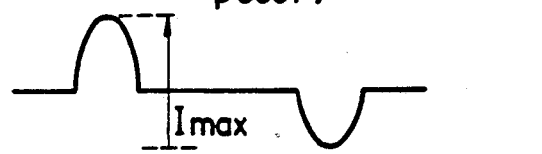
Figure 10:
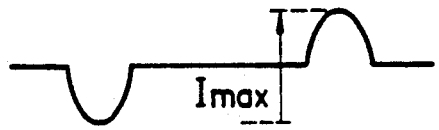
Figure 10:
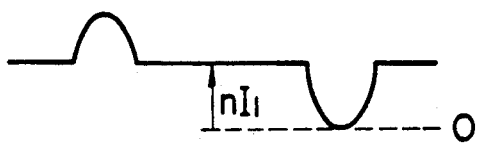

In this manner, the third embodiment has its load capacitance driven more intensely than the prior art counterpart by as much as the current of $nI_1 \cdot (h_{FEP}+1)$. Where the current amplification factor $h_{FE}$ of the PNP transistor is small on the high frequency band, a high frequency characteristic is still obtained. That is, the wide band push-pull amplifier as the third embodiment extends its frequency characteristic into the high frequency band without sacrificing the dynamic range. FIG. 10 is a waveform representation of currents that flow through the emitters of the second, third and fifth transistors Q32, Q33 and Q35 in the third embodiment where a pulse signal $P_{OUT}$ is output from the input terminal in response to a pulse signal $P_{IN}$ entering the input terminal.

Figure 11:
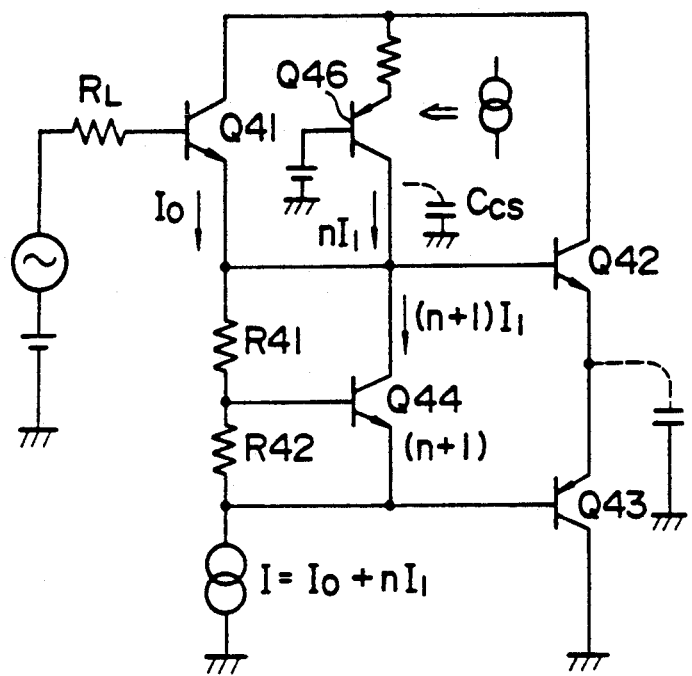
FIG. 11 is a circuit diagram of a wide band push-pull amplifier practiced as a fourth embodiment of the invention.

Given the third embodiment, one way to increase the current I flowing through the constant current source 31 without raising the current $I_0$ flowing through the emitter of the first transistor Q31 is to resort to a wide band push-pull amplifier practiced as the fourth embodiment, a circuit diagram of which is depicted in FIG. 11. In the fourth embodiment, a sixth transistor Q46 is furnished in parallel with the first transistor 41. Because the PNP transistor has a large capacitance $C_{CS}$ between collector and ground, the construction of the fourth embodiment worsens the frequency characteristic. As described, the PNP transistor has a low transition frequency $f_T$. For this reason, the current amplification factor $h_{FE}$ of the PNP transistor arrangement drops as soon as the high frequency band is reached. The drop in the current amplification factor $h_{FE}$ reduces the collector current of the transistor Q46 and boosts the emitter current of the transistor Q41, thereby causing the same kind of DC loss as with the prior art circuit. This means that, unlike the third embodiment of FIG. 8, the fourth embodiment as it is may not improve concurrently both the frequency characteristic and the dynamic range.

This drawback is circumvented by causing the current not passing through the first transistor in the input stage to flow into the current source. The arrangement is intended to drive the output push-pull circuit made of the second and third transistors in the output stage. With the output push-pull circuit driven in this manner, the current flowing to the current source is raised without increasing the amount of the current flowing through the first transistor. This in turn allows the push-pull circuit to drive the load capacitance more efficiently. With the load capacitance better driven, the frequency characteristic is enhanced without causing the input impedance of the first transistor to promote a voltage drop, i.e., without sacrificing the dynamic range.

While preferred embodiments of the invention have been described using specific terms, such description is for illustrative purposes only, and it is to be understood that changes and variations may be made without departing from the spirit or scope of the following claims.

What is claimed is:

1. A wide band frequency amplifier comprising:

a first transistor and a second transistor forming a first push-pull amplifier circuit;

a first current source having a first end connected to a base of said second transistor and a second end connected to ground;

a first bias voltage source connected between a base of said first transistor and said base of said second transistor;

a third transistor coupled to said first transistor in Darlington connection, said third transistor driving said first and second transistors using an input signal;

a fourth transistor and a fifth transistor forming a second push-pull amplifier circuit;

a second current source having a first end connected to a base of said fifth transistor and a second end connected to ground;

a second bias voltage source connected between a base of said fourth transistor and said base of said fifth transistor;

a sixth transistor coupled to said fourth transistor in Darlington connection, said sixth transistor driving said fourth and fifth transistors using said input signal; and a phase element connected between said base of said second transistor and an output end of said second push-pull amplifier circuit, said phase element causing said second and fifth transistors to operate in Darlington connection at a trailing edge of said input signal.

2. A wide band frequency amplifier according to claim 1, wherein said fifth transistor is n times the size of said fourth transistor.

3. A wide band frequency amplifier comprising:

first and second transistors forming a push-pull amplifier circuit;

a first current source having a first end connected to a base of said second transistor and a second end connected to ground;

a first bias voltage source connected between a base of said first transistor and said base of said second transistor;

a third transistor coupled to said first transistor in Darlington connection, said third transistor driving said first and second transistors using an input signal;

a fourth transistor connected to said third transistor in parallel, a base of said fourth transistor receiving said input signal;

a second current source having a first end connected to an emitter of said fourth transistor and a second end connected to ground; and a phase element connected between said emitter of said fourth transistor, said second current source and said base of said second transistor, said phase element pulling a base current of said second transistor into said second current source at a trailing edge of said input signal.

4. A wide band push-pull amplifier comprising:

an output push-pull circuit containing a second NPN transistor and a third PNP transistor;

a first transistor provided in an input stage in order to drive said second NPN transistor, said first transistor coupled to said second NPN transistor in Darlington connection;

bias circuit means provided between an emitter of said first transistor and a current source, for supplying a bias current to a base of said second NPN transistor and to a base of said third PNP transistor; and a fourth transistor connected between said base of said third PNP transistor and a power source.

* * * * *